(12) United States Patent
Numanami et al.

(10) Patent No.: US 7,145,394 B2
(45) Date of Patent: *Dec. 5, 2006

(54) HIGH FREQUENCY POWER AMPLIFIER MODULE, AND WIRELESS COMMUNICATION SYSTEM

(75) Inventors: Masahito Numanami, Komoro (JP); Hitoshi Akamine, Maebashi (JP); Tsuyoshi Shibuya, Komoro (JP); Tetsuaki Adachi, Chiisagata (JP); Masatoshi Morikawa, Hannou (JP); Yasuhiro Nunogawa, Takasaki (JP)

(73) Assignees: Renesas Technology Corp., Tokyo (JP); Hitachi Tohbu Semiconductor, Ltd., Takasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/098,454

(22) Filed: Apr. 5, 2005

(65) Prior Publication Data

US 2005/0208905 A1    Sep. 22, 2005

Related U.S. Application Data

(60) Continuation of application No. 10/614,015, filed on Jul. 8, 2003, now Pat. No. 6,897,728, which is a division of application No. 10/122,382, filed on Apr. 16, 2002, now Pat. No. 6,617,927, which is a continuation of application No. 09/716,935, filed on Nov. 22, 2000, now Pat. No. 6,433,639.

(30) Foreign Application Priority Data

Dec. 13, 1999  (JP)  .................. 11-353355

(51) Int. Cl.
*H03F 3/16*   (2006.01)
(52) U.S. Cl. ...................... 330/277; 330/296
(58) Field of Classification Search ........... 330/277, 330/291, 293, 296
See application file for complete search history.

(56) References Cited

U.S. PATENT DOCUMENTS

| | | | |
|---|---|---|---|
| 4,255,714 A | | 3/1981 | Rosen |
| 4,379,269 A | | 4/1983 | Ijichi |
| 4,409,557 A | | 10/1983 | Sechi |
| 4,783,849 A | | 11/1988 | Muterspaugh |
| 4,806,876 A | * | 2/1989 | Usui et al. .................. 330/279 |
| 4,905,306 A | * | 2/1990 | Anderson ................ 455/191.3 |
| 5,408,198 A | | 4/1995 | Kusunoki |
| 5,841,320 A | * | 11/1998 | Ichihara ...................... 330/133 |

* cited by examiner

*Primary Examiner*—Henry Choe
(74) *Attorney, Agent, or Firm*—Mattingly, Stanger, Malur & Brundidge, P.C.

(57) ABSTRACT

A high frequency power amplifier module of a multistage amplifier construction comprising: an input terminal; an output terminal; a control terminal; and a mode switching terminal. The first amplification stage includes a dual gate FET, and a bias voltage according to a signal is applied to the first gate and the second gate of the dual gate FET from the control terminal and the mode switching terminal, and a radio signal from the input terminal is applied to the second gate such as the source of the dual gate FET. In dependence upon the signal from the mode switching terminal, the mode of the high frequency power amplifier module is for the GSM (i.e., for a non-linear amplifying action) and for the EDGE (for a linear amplifying action).

2 Claims, 9 Drawing Sheets

HIGH FREQUENCY POWER AMPLIFIER MODULE, AND WIRELESS COMMUNICATION SYSTEM

This is a continuation application of U.S. Ser. No. 10/614,015, filed Jul. 8, 2003, now U.S. Pat. No. 6,897,728 which is a divisional of U.S. Ser. No. 10/122,382, filed Apr. 16, 2002, now U.S. Pat. No. 6,617,927, which is a continuation of U.S. Ser. No. 09/716,935, filed Nov. 22, 2000, now U.S. Pat. No. 6,433,639.

BACKGROUND OF THE INVENTION

The present invention relates to a high frequency power amplifier module (or a high frequency power amplifier) including a plurality of amplification lines for linear amplifications and for non-linear amplifications (or saturated amplifications), and a wireless communication system packaging the high frequency power amplifier module. More particularly, the invention relates to a technique effective when applied to a multi-mode communication type cellular mobile phone having a plurality of communication functions of different communication modes.

In North America, in recent years, there has been employed the so-called "dual mode mobile phone" in which there are incorporated into one mobile phone: the analog type AMPS (Advanced Mobile Phone Service) employed in the prior art and covering the entire North America; and the digital system such as the TDMA (Time Division Multiple Access) or the CDMA (Code Division Multiple Access).

In Europe and so on, on the other hand, there has been employed the GSM (Global system for Mobile Communication) system using the TDMA technique and the FDD (Frequency Division Duplex) technique. In the GSM system, on the other hand, there has been developed the EDGE (Enhanced Data Rates for GSM Evolution) system as the communication system capable of enhancing the transmission rate.

The multi-mode communications by the dual mode mobile phone or the like are described, for example, on pp. 115 to 126 of "NIKKEI ELECTRONICS" (No. 681), issued by NIKKEI BP on Jan. 27, 1997.

Into the wireless communication system (or the mobile phone), there is incorporated an amplifier (or the high frequency power amplifier module) packaging transistors in multiple stages. The communication system is seriously influenced by the performance of the high frequency power amplifier module.

In Japanese Patent Laid-Open No. 154321/1992, there is disclosed a high frequency power amplifier which can control the high frequency output power over a wide range while retaining the satisfactory linear characteristics and the power efficiency stably. This high frequency power amplifier has a multistage construction using a MOSFET (Metal Oxide Semiconductor Field Effect Transistor) or a GaAs-FET in the final stage circuit so that the high frequency output power is variably controlled by changing the bias condition of the drive circuit from the outside while keeping the bias of the final stage circuit constant. There is also disclosed a technique for controlling the output power by incorporating a variable attenuator circuit into a high frequency input line of the aforementioned circuit.

In Japanese Patent Laid-Open No. 26776/1999, on the other hand, there is disclosed a power amplifier which can reduce the power consumption without increasing the distortion and can improve the power efficiency. This power amplifier has a high frequency circuit employing a dual gate FET. This power amplifier is constructed such that two stages of dual gate FETs are cascade-connected between an input terminal In and an output terminal OUT. Specifically, the first gate on the drain side of the dual gate FET at the first stage is connected with the input terminal IN, and the drain is connected with the first gate on the drain side of the dual gate FET at the final stage. The drain of the dual gate FET at the final stage is connected with the output terminal OUT. The first gates of the first stage and the final stage are connected with a first gate input terminal G1, and the second gates of the first stage and the final stage are connected with a second gate input terminal G2.

SUMMARY OF THE INVENTION

Most wireless data communications, as used in the mobile communications, are effected at a transmission rate of 9.6 Kbps. Since a higher transmission speed has been demanded for accessing to the internets or data bases of enterprises, however, there has been needed a communication system for the high speed. The GSM system servicing mainly in Europe and Asia has the transmission rate of 9.6 Kbps at present. In order to satisfy the demands thus far described, however, there has been developed the EDGE system having the high transmission rate. By introducing this system, the data transmission rate is raised to as high as 48 Kbps so that data of four times as high as that of the GSM system can be transmitted for a unit of time.

Another advantage of the EDGE system is that it can be run without introducing any new infrastructure because it is practiced by using the basic system of the GSM with a partial change in the wireless modulation method. This little change is attractive for many communication businessmen.

For the modulation method, the GSM system adopts the GMSK (Gaussian Minimum Shift Keying) modulation, but the EDGE system adopts the $3\pi/8$-rotating 8PSK (Phase Shift Keying) modulation. This means the change from the GMSK modulation method to the $3\pi/8$-rotating 8PSK modulation method. For this change in the modulation method, the signal transmission unit of the wireless communication system is required to have a higher linearity.

Since the EDGE system is developed from the GSM system, one mobile phone can desirably communicate with the GSM system and the EDGE system. This makes it necessary to incorporate both an amplifier for the GSM system and an amplifier for the EDGE system in the mobile phone.

We have examined a high frequency power amplifier module which can cover both the GSM system and the EDGE system with one amplifier and have found out the following problems to be solved.

(1) The transistor acts, when employed in the GSM, in the saturated state so that a high power is demanded. For an input signal at about 0 dBm, as modulated in the GMSK, an output power required is about 36 dBm at the maximum.

(2) The transistor acts, when employed in the EDGE, in the linear state so that a linearity is demanded. For an input signal modulated at the $3\pi/8$-rotating 8 PSK, specifically, no distortion is required for the output signal. On the other hand, the maximum of the linear output power is within a range of about 28 to 29 dBm.

(3) Since the GSM system and the EDGE system have a large difference in the output power, as described above, it is questionable how to realize the two system with the single amplifier. Specifically, the system for making the non-linear action and the linear action compatible is exemplified by the AMPS (for the saturated action)/the CDMA (for the linear action) of North America. In this case, the maximum output power is about 30 to 32 dBm for the AMPS but about 28 to 29 dBm for the CDMA, so that the different is 2 to 3 dBm. Therefore, the compatible system is easily enabled to match the two actions by making the input power variable, even if it is operated at the same bias voltage. In the GSM/EDGE, however, the maximum power has a difference as large as 6 to 8 dBm so that the two system cannot be made compatible with one circuit.

(4) The mobile phone is powered by the battery so that it is required to a higher efficiency for a longer use. For example, the GSM is required to have an efficiency of about 50 to 60%, and the EDGE is required to have an efficiency of about 35 to 40%. This makes it desirable to make the used power amplification element as small as possible.

An object of the invention is to provide a high frequency power amplifier module and a wireless communication system for making the GSM system (for the saturated action) and the EDGE system (for the linear action) compatible in one circuit.

Another object of the invention is provide a high frequency power amplifier module and a wireless communication system, which can improve the AM modulation (or the AM—AM conversion).

Still another object of the invention is to provide a high frequency power amplifier module and a wireless communication system, which can easily isolate input and output terminals while causing little signal leakage.

The foregoing and other objects and novel features of the invention will become apparent from the description to be made with reference to the accompanying drawings.

The representative of the invention to be disclosed herein will be briefly summarized in the following.

(1) According to an aspect of the invention, there is provided a high frequency power amplifier module having a multistage amplifier construction, in which a plurality of semiconductor amplification elements are sequentially cascade-connected. The high frequency power amplifier module includes at least an input terminal, an output terminal, a control terminal and a mode switching terminal as its external terminals. The amplification element at the first stage is exemplified by a dual gate FET, which is fed at a first gate $G_1$ close to its drain with a signal from the control terminal and at a second gate $G_2$ with a radio signal from the input terminal. To the second gate $G_2$, on the other hand, there is applied a bias voltage which is based on the signal from the control terminal and a signal from the mode switching terminal. In accordance with the signal from the mode switching terminal, the high frequency power amplifier module is caused to act as an amplifying line for the GSM or an amplifying line for the EDGE. In this case, the amplifying line for the GSM system acts non-linearly so that its output power is about 36 dBm at the maximum, and the amplifying line for the EDGE system acts linearly so that its output power is about 29 dBm at the maximum.

According to this means:

(a) the GSM system (for the saturated action) and the EDGE system (for the linear action) can be realized in the common circuit; and (b) in the high frequency power amplifier module of the multistage amplifier construction, the input stage (or the first stage) is constructed to include a dual gate FET which is fed at its first gate with a control voltage. As seen from a graph of FIG. 3, therefore, the AM—AM conversion (AMout) can be improved to 16% or less for an input power Pin of 6 dBm or higher.

DESCRIPTION OF THE PREFERRED EMBODIMENTS

The invention will be described in detail in connection with its embodiments with reference to the accompanying drawings. Throughout all the drawings for explaining the embodiments of the invention, the components having identical functions will be designated by the common reference numerals, and their repeated description will be omitted.

Embodiment 1

Figure 1:
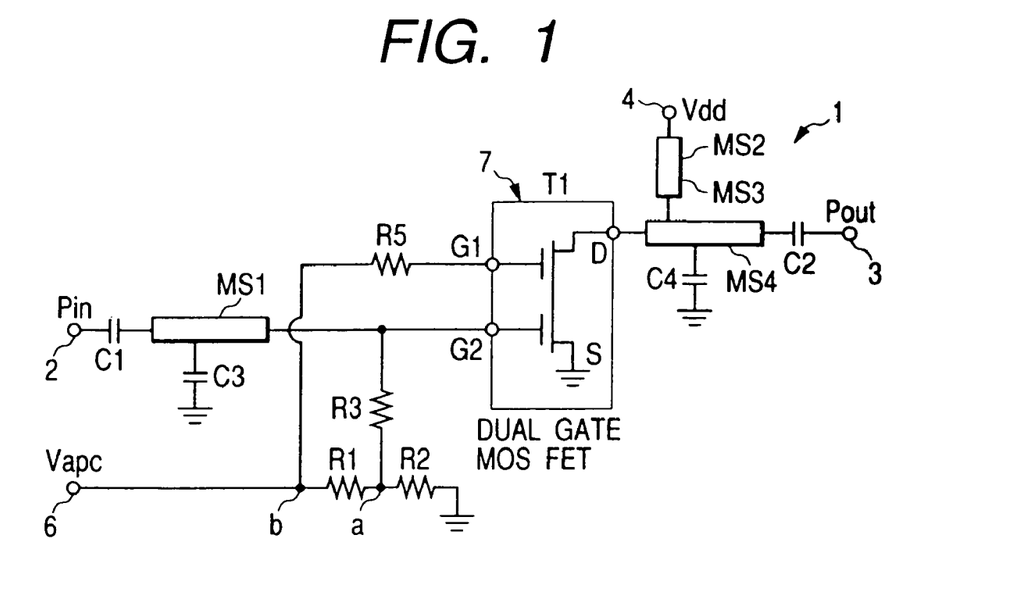
FIG. 1 is a circuit diagram of a high frequency power amplifier module according to one embodiment (or Embodiment 1) of the invention.

FIG. 1 is a circuit diagram of a high frequency power amplifier module (or a high frequency power amplifier) according to one embodiment (or Embodiment 1) of the invention. Embodiment 1 will be described on the case in which a semiconductor amplification element (or transistor) is exemplified by a dual gate field effect transistor (or dual gate FET).

A high frequency power amplifier module 1 of Embodiment 1 is provided as its external electric terminals with: an input terminal 2 to be fed with an input signal Pin (i.e., a signal to be amplified); an output terminal 3 for outputting an output signal Pout; a first voltage terminal 4 fixed at a first reference potential Vdd; a not-shown second voltage terminal fixed at a second reference potential Vss (e.g., at the ground); and a control terminal 6 to which a variable voltage Vapc is applied.

The high frequency power amplifier module 1 has a single stage amplifier construction for amplifications with one semiconductor amplification element (or transistor) or a multistage amplifier construction for individual amplifications with a plurality of transistors which are sequentially cascade-connected. Embodiment 1 will be described on the high frequency power amplifier module of the single stage construction in which the dual gate FET is packaged as the transistor.

A transistor T1, i.e., a dual gate FET 7 is connected at its second gate $G_2$ with the input terminal 2 through a microstrip line MS1. A capacitor C1 is connected in series between the microstrip line MS1 and the input terminal 2, and a capacitor C3 is connected in parallel between the microstrip line MS1 and the ground (i.e., the second reference potential Vss).

Between a node b between a resistor R1 and the control terminal 6 and a first gate $G_1$ of the dual gate FET 7, on the other hand, there is connected in series a resistor R5 for setting the potential to be applied to the first gate $G_1$.

With the second gate $G_2$ of the dual gate FET 7, on the other hand, there are connected two resistors R1 and R2, of which the lower potential resistor R2 is connected with the ground whereas the higher potential resistor R1 is connected with the control terminal 6, thereby to construct a resistance-type potential dividing circuit (or a breeder circuit). Between a node a between the two resistors R1 and R2 and the second gate $G_2$, on the other hand, there is connected a resistor R3 for setting a potential to be applied to the second gate $G_2$. This resistor R3 is effective for suppressing such an impedance on the side of the resistance-type potential dividing circuit as will influence the second gate $G_2$.

On the other hand, a drain terminal D or the first terminal of the dual gate FET 7 is connected with the first voltage terminal 4 through microstrip lines MS3 and MS2 and with the output terminal 3 through a microstrip line MS4 and a capacitor C2. To the first voltage terminal 4, there is applied the first reference potential Vdd as the power voltage. On the other hand, the second terminal of the dual gate FET 7 acts as a source terminal S and is connected with the ground potential (or the second reference potential Vss). Moreover, a capacitor C4 is connected between the microstrip line MS4 and the ground, although not especially limitative thereto.

Figure 4:
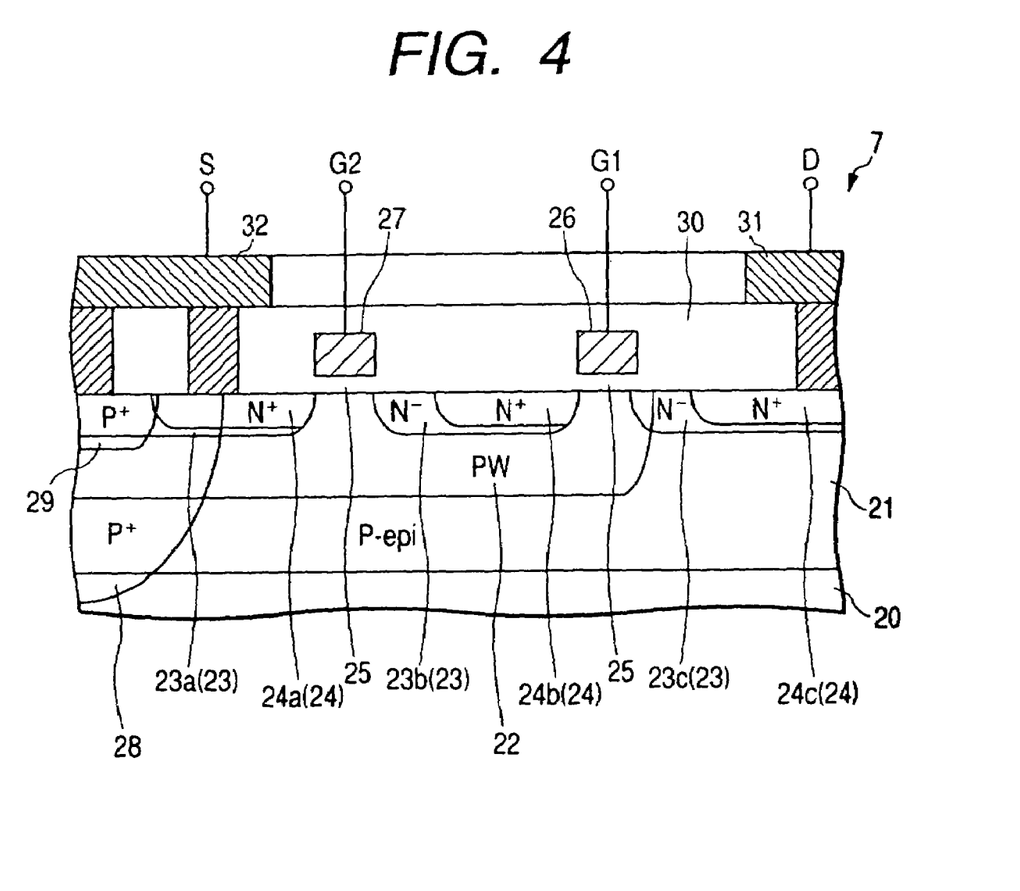
FIG. 4 is a sectional view showing a sectional structure of a portion of the dual gate FET packaged in the high frequency power amplifier module of Embodiment 1.

Here will be briefly described the construction of the dual gate FET 7 with reference to FIG. 4.

The dual gate FET 7 is made of either a compound semiconductor such as GaAs or Si (silicon) and will be described in Embodiment 1 on the case in which it is exemplified by a Si-MOSFET. FIG. 4 is a sectional view showing a cell portion of the dual gate FET 7, which is fabricated by doping a P-type epitaxial layer 21, as formed over on face (or upper face) of a substrate 20 of Si, selectively with predetermined impurity atoms to form an N-type (e.g., $N^+$-type or $N^-$-type) or P-type (e.g., $P^+$-type) semiconductor region.

Specifically, a P-type well 22 is selectively formed in the surface layer portion of the epitaxial layer 21, and $N^-$-type regions 23 are formed individually in the P-type well 22 and in the region from the P-type well 22 and outside of the P-type well 22. In FIG. 4, three $N^-$-type regions 23a, 23b and 23c are arranged from left to right. The $N^-$-type region 23c at the righthand end extends at its lefthand end portion into the P-type well 22. In the surface layer portions of the $N^-$-type regions 23a, 23b and 23c, there are formed $N^+$-type regions 24 (as indicated by 24a, 24b and 24c from left to right) in the region or at or slightly over one end of the region.

The surface layer portions of the P-type region between the $N^+$-type region 24a and the and $N^-$-region 23b and between the region $N^+$-type region 24b and the $N^-$-type region 23c provide channels, over which there is individually formed gate insulating film 25 which is overlaid by a first gate electrode 26 or a second gate electrode 27.

At the lefthand end portion, on the other hand, there are formed a $P^+$-type region 28 depthwise extending through the epitaxial layer 21 to the surface layer portion of the substrate 20, and a $P^+$-type region 29 depthwise extending to the surface layer portion of the P-type well 22. Of these, the $P^+$-type region 28 is formed on the lefthand side from midway of the $N^+$-type region 24a at the lefthand end portion, and the $P^+$-type region 29 is so formed on the lefthand side from the lefthand end portion of the $N^+$-type region 24a as to overlie the $N^-$-type region 23.

On the other hand, the epitaxial layer 21 (or the substrate 20) is covered on its surface with an insulating film forming the gate insulating film 25 and a layer insulating film 30 formed over the former insulating film. This layer insulating film 30 covers the first gate electrode 26 and the second gate electrode 27, too.

In the layer insulating film 30 over the $N^+$-type regions 24a and 24c and the $P^+$-type region 29, there are formed contact holes, and the electrodes are selectively disposed over the contact holes and the layer insulating film 30. Of these, the electrode over the $N^+$-type region 24c provides a drain electrode 31, and both the electrodes over the $N^+$-type region 24a and the $P^+$-type region 29 are connected over the layer insulating film 30 to provide a source electrode 32. Therefore, the first gate electrode 26 is closer to the drain whereas the second gate electrode 27 is closer to the source.

Here, the semiconductor chip thus provided with the dual gate FET 7 is further provided with a resistor and/a capacitor, if necessary. Also provided is a transistor for constructing a current mirror circuit, as will be described hereinafter.

For such dual gate FET 7, a bias voltage is generated by the resistors R1, R2, R3, R5 and so on. This bias voltage has characteristics, as illustrated in FIG. 2.

Figure 2:
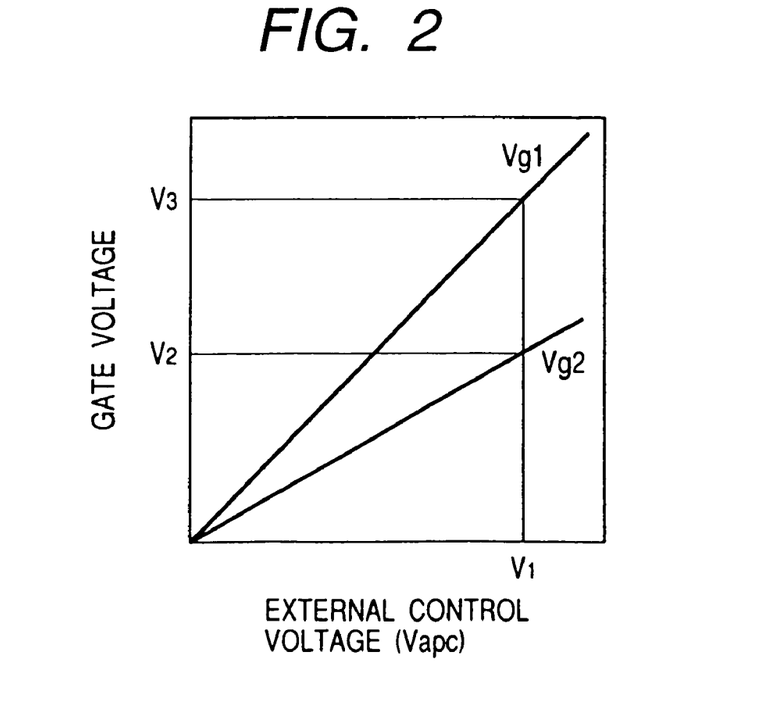
FIG. 2 is a graph illustrating correlations between an external control voltage and a gate voltage in the high frequency power amplifier module packaging a dual gate FET according to Embodiment 1.

FIG. 2 is a graph illustrating correlations between a control voltage (e.g., the external control voltage) Vapc and a gate voltage (e.g., the voltage at the first gate $G_1$ or the voltage at the second second gate $G_2$). Letters Vg1 designate the voltage characteristics of the first gate $G_1$, and letters Vg2 designate the voltage characteristics of the second gate $G_2$. Both of these characteristics exhibit a linearity, the gradients of which are steeper at the voltage characteristics Vg1 than at the voltage characteristics Vg2. In the graph, a control voltage $V_1$ and a first gate $G_1$ voltage $V_3$ are set to equal levels such as about 2 to 2.5 V. When the control voltage Vapc is at the level $V_1$, moreover, a voltage $V_2$ to be applied to the second gate $G_2$ is set to about one half of the level $V_3$.

Therefore, the FET to act at the first gate closer to the drain of the dual gate FET acts (ON) faster than the FET to act at the second gate closer to the source of the dual gate FET but does not act (OFF) later than the FET to act at the second gate closer to the source. As a result, it is possible to reduce the noise in the OFF state. On the other hand, the change in a mutual conductance $g_m$ of the FET to act at the first gate is larger than that of the FET to act at the second gate. In other words, there is achieved an effect that the gain control range is widened.

The high frequency power amplifier module 1 of Embodiment 1 is constructed such that the control voltage Vapc is fed to the first gate $G_1$ of the dual gate FET 7. When the system is OFF, therefore, no voltage is applied to the first gate $G_1$ so that the second gate $G_2$ and the drain can be electrically isolated to reduce the leakage (or noise) transmission of the input power from the second gate $G_2$ to the drain. This circuit construction can also be employed in the GSM system of non-linear actions (for the saturated actions) or the EDGE system of linear actions to achieve the noise reduction in the system OFF state.

Figure 3:
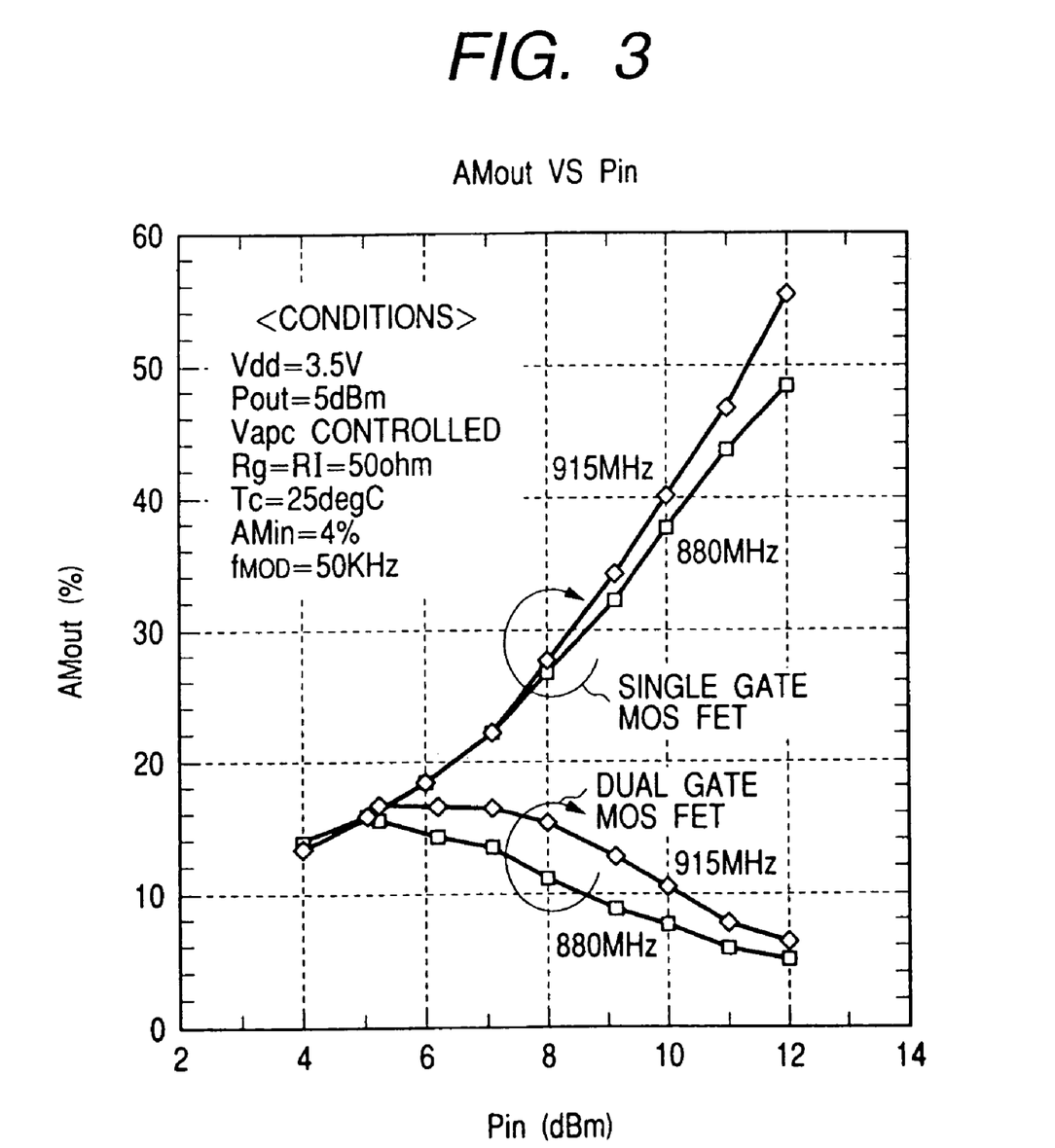
FIG. 3 is a graph plotting an AM modulation by the high frequency power amplifier module of Embodiment 1.

The high frequency power amplifier module 1 of Embodiment 1 has an effect for improving the AM—AM conversion. FIG. 3 is a graph plotting the AM—AM conversion characteristics. The abscissa indicates the power Pin (in dBm) of the input signal Pin, and the ordinate indicates an AMout (or the AM—AM conversion). In the case of the single gate, the output power at the measuring time is controlled to a constant value, but the voltage Vapc has a tendency to be lowered as the input power increases. As exemplified by the single gate MOSFET, therefore, the AM—AM conversion (AMout) grows the higher (or the worse) as the input power increases. The reduction in the voltage Vapc implies the reduction in the gate bias voltage of the single gate MOSFET. When the gate bias voltage is lowered, the MOSFET does the amplification in the non-linear region near the threshold voltage so that the output waveform is distorted to have a worse AM distortion.

Even in case the dual gate MOSFET is employed as in Embodiment 1 (of FIG. 1), on the contrary, the AMout is improved, as shown in FIG. 3. This is an example of the comparison between the case of the service frequency band of 880 MHz of the GSM and the case of 915 MHz. In the dual gate MOSFET, a relatively high bias voltage is applied to the gate of the drain side MOSFET so as to prevent the power voltage to be applied to the source side MOSFET from drastically dropping. In short, there is applied a higher gate bias voltage than that of the single gate MOSFET. Therefore, the gate bias voltage is set to a higher level than the threshold voltage of the drain side MOSFET so that the amplifications are performed in a more linear region to reduce the distortion of the output. As a result, the AM distortion is improved. In other words, the single gate MOSFET operates in a state approximate the class "C" amplifier. In the dual gate MOSFET, for an equal output power, the balance between the power voltage and the gate bias voltage can be changed to a state approximate the class "A" amplifier, thereby to reduce the distortion of the waveform.

Here, the AM—AM conversion characteristics indicate the distortion which is made at the output side when an amplitude-modulated signal is superposed on the carrier wave.

As the effects for the AM—AM conversion, on the other hand, similar improvements and effects can also be expected, in the case of the multistage amplifications of the circuit of FIG. 1: when used (1) at the input stage (or the first stage) in the two-stage amplifier; (2) at the input stage or the drive stage (or the second stage) of a three-stage amplifier; and (3) at the input stage and the drive stage of the three-stage amplifier.

Embodiment 1 has been described on the high frequency power amplifier module which packages the single semiconductor amplification element, but the invention could also be applied to the high frequency power amplifier module of the multistage amplifier construction in which the plurality of semiconductor amplification elements are sequentially cascade-connected, as has been described hereinbefore.

Figure 5:
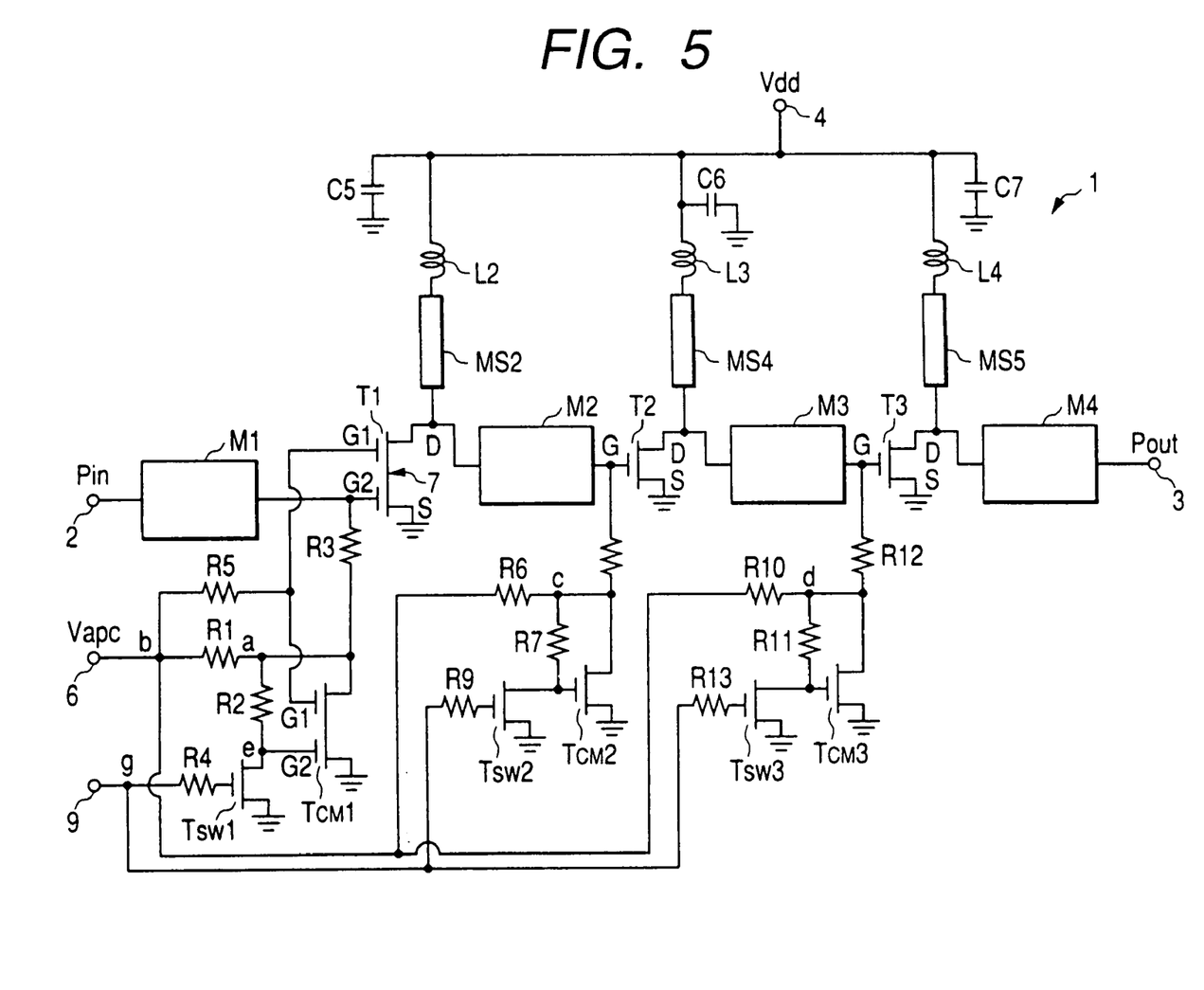
FIG. 5 is a circuit diagram schematically showing the high frequency power amplifier module of one embodiment of the invention.
Figure 6:
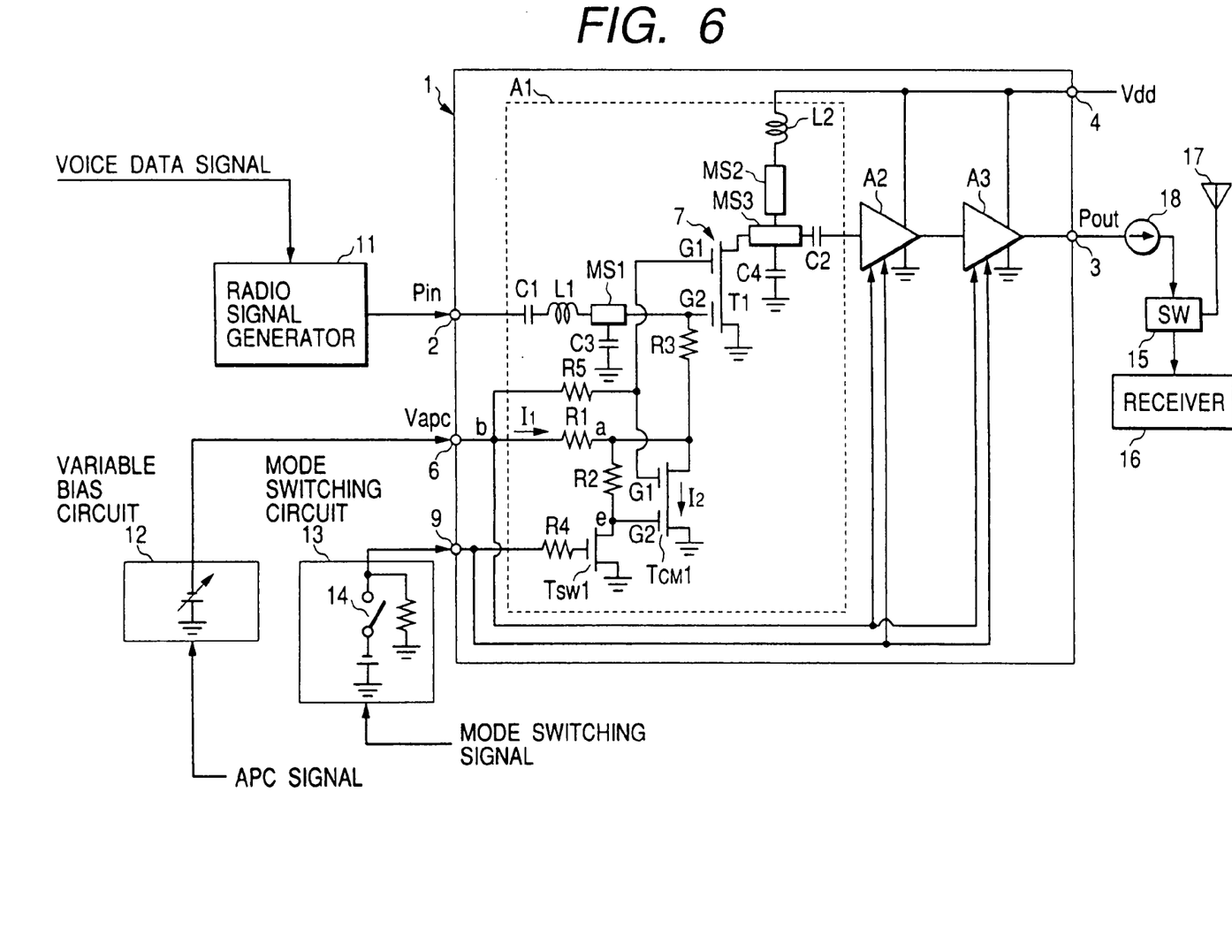
FIG. 6 is a block diagram schematically showing a construction of a wireless communication system packaging the high frequency power amplifier module of the embodiment.

As a more specific embodiment of the invention, here will be described with reference to FIGS. 5 and 6 a high frequency power amplifier module of a three-stage amplifier construction which can perform the amplifications of the GSM system and the EDGE system by switching the modes. FIG. 5 is a circuit diagram of the high frequency power amplifier module of Embodiment 1, and FIG. 6 is a block diagram showing a construction of a wireless communication system (or a mobile phone) packaging the high frequency power amplifier module of Embodiment 1.

The high frequency power amplifier module 1 of this embodiment is constructed, as shown in FIG. 5, to have three stage amplifications, of which the first stage (or the input stage) uses the transistor T1 having the dual gate FET structure whereas the second stage (or the drive stage) and the third stage (or the final stage: the output stage) use a single gate Si-MOSFETs (i.e., transistors T2 and T3).

The transistors T1, T2 and T3 are sequentially cascade-connected between the input terminal 2 and the output terminal 3, and matching circuits M1 to M4 are interposed between the individual stages. On the other hand, the drain terminals D of the individual transistors T1, T2 and T3 are connected through microstrip lines MS2, MS4 and MS5 and coils L2, L3 and L4 with the first voltage terminal 4 to be fed with the first reference potential Vdd. Between the first voltage terminal 4 and the individual coils L2, L3 and L4, on the other hand, there are connected in parallel capacitors C5 to C7 which are connected at their one-end electrodes with the ground. Here, the coils may be parasitic.

On the other hand, each stage is provided with a bias circuit, a current mirror circuit for temperature compensations, and a mode switching circuit for switching the modes of the GSM system and the EDGE system. In order to construct the current mirror circuit: a current mirror circuit transistor $T_{CM}1$ of the dual gate FET construction is monolithically formed in the semiconductor chip to be used at the first stage; a current mirror circuit transistor $T_{CM}2$ of the single gate FET construction is monolithically formed in the semiconductor chip to be used at the second stage; and a current mirror circuit transistor $T_{CM}3$ of the single gate FET construction is monolithically formed in the semiconductor chip to be used at the third stage.

The mode switching circuit is provided with mode switching transistors (MOSFETs) $T_{SW}1$ to $T_{SW}3$ which are connected at their gate electrodes with a mode switching terminal 9 through resistors R4, R9 and R13, respectively.

The bias circuit is constructed to include individually three sets of resistors (R1 to R3, R6 to R8, and R10 to R12) which are connected at their one-end terminals with nodes a, c and d, respectively. The first transistors R1, R6 and R10 are connected with the control terminal 6; the second transistors R3, R8 and R12 are connected with the gate electrodes G of the transistors T1, T2 and T3 (e.g., the second gate $G_2$ of the transistor T1); and the third resistors R2, R7 and R11 are connected with the drains of the mode switching transistors $T_{SW}1$ to $T_{SW}3$ and the gates G of the current mirror circuit transistors $T_{CM}1$ to $T_{CM}3$ (e.g., the second gate $G_2$ of the transistor $T_{CM}1$).

The drains of the current mirror circuit transistors $T_{CM}1$ to $T_{CM}3$ are connected with the nodes a, c and d and further with the gates G of the transistors $T_{CM}1$ to $T_{CM}3$ (e.g., the second gate $G_2$ of the transistor $T_{CM}1$) through the resistors R2, R7 and R11. On the other hand, the mode switching transistors $T_{SW}1$ to $T_{SW}3$ and the current mirror circuit transistors $T_{CM}1$ to $T_{CM}3$ are grounded at their sources to the earth.

At the first stage, on the other hand, the control terminal 6 is connected through the resistor R5 with the individual first gates G1 of the transistor T1 and the current mirror circuit transistor $T_{CM}1$.

The high frequency power amplifier module 1 thus constructed is packaged in the cellular mobile phone (or the wireless communication system), as shown in FIG. 6. In FIG. 6: the first stage, as constructed of the dual gate FET 7 or the like of the high frequency power amplifier module 1, is an amplifier A1; the second state is an amplifier A2; and the third stage is an amplifier A3, of which the amplifier A1 is partially shown in the same state as that of FIG. 1.

In the mobile phone, the input terminal 2 of the high frequency power amplifier module 1 is connected with a radio signal generator 11. This radio signal generator 11 receives a voice or a data signal, and converts it and outputs a high frequency signal. This output signal is fed as the input signal Pin to the input terminal 2.

The control signal (or the APC signal) is processed by a variable bias circuit 12, the output of which is fed as the control voltage signal Vapc to the control terminal 6.

The mobile phone is operated, each time it is used, with its select keys to select either the GSM system or the EDGE system. Specifically, the mode switching signal, the state of which is determined by the operation of the select keys, is fed to a mode switching circuit 13 to turn ON/OFF a switch 14. Thus, the mode switching circuit 13 generates a mode switching signal voltage according to the operation of the select keys, so that the mode switching signal voltage is fed to the mode switching terminal 9. The mode switching transistors $T_{SW}1$ to $T_{SW}3$ are controlled by that mode switching signal.

The high frequency power amplifier module 1 is connected at its output terminal 3 with a transmission/reception change-over switch 15. With this transmission/reception change-over switch 15, there is connected not only a receiving circuit 16 but also an antenna 17.

On the other hand, the output power, as outputted from the output terminal 3, is detected by a detector 18. The detection result of this detector 18 is fed to a not-shown APC circuit, from which the aforementioned APC signal is outputted.

Here will be described the GSM mode and the EDGE mode with reference to FIGS. 6 and 5.

In the GSM mode, the mode switching circuit 13 is turned ON so that a voltage exceeding a constant level is applied to the mode switching terminal 9. When the voltage exceeding the constant level is applied to the mode switching terminal 9, the mode switching transistor $T_{SW}1$ is biased at its gate so that it is turned ON. When the mode switching transistor $T_{SW}1$ is turned ON, the resistance of (R1+R2) overcomes the ON resistance of the mode switching transistor $T_{SW}1$ sufficiently so that the potential of a node e becomes substantially equal to the ground potential. Therefore, the current mirror circuit transistor $T_{CM}1$ is in the off state. As a result, a current $I_2$ does not flow between the drain and source of the current mirror circuit transistor $T_{CM}1$. At this time, a bias current $I_1$ is caused to flow by the voltage applied from the variable bias circuit 12 so that the voltage at the node a, as divided by the resistor R1 and the resistor R2, is applied to the second gate $G_2$ of the dual gate FET 7 composing the first stage transistor T1.

In the GSM mode, the output powers of the second and third stage amplifiers A2 and A3 are also controlled as at the first stage by the voltage which is generated by the variable bias circuit 12. In the GSM mode, the power amplifier module is employed in the non-linear action so that the maximum output power is about 35 dBm.

In the EDGE mode, the mode switching circuit 13 is turned OFF so that a voltage at a constant (about 0 V) or lower level is applied to the mode switching terminal 9. As a result, the mode switching transistor $T_{SW}1$ is biased at its gate with substantially 0 V so that it is turned OFF. In the EDGE mode, on the other hand, the bias voltage, as generated by the variable bias circuit 12, is fixed at an arbitrary value (for which a plurality of values may be prepared and changed for the situations). In this case, the output power Pout is controlled by changing the magnitude of an input signal RFin (or Pin). Upstream of the input terminal 2, more specifically, there is provided a gain control circuit, by which the magnitude of the input signal Pin is changed to change the magnitude of the output power Pout.

When the mode switching transistor $T_{SW}1$ is turned OFF, no current flows between the node a (at the potential of the second gate $G_2$ of the current mirror circuit transistor $T_{CM}1$) and the node e (at the potential of the drain of the mode switching transistor $T_{SW}1$) so that the node a and the node e take the same potential.

In the state where an arbitrary voltage for the EDGE actions is applied from the variable bias circuit 12, a predetermined bias is applied to both the first gate $G_1$ and the second gate $G_2$ of the current mirror circuit transistor $T_{CM}1$. As a result, the current mirror circuit transistor $T_{CM1}$ is ON. At this time, the bias current $I_2$ is caused to flow by the voltage applied from the variable bias circuit 12. Since the second gate $G_2$ and the drain of the current mirror circuit transistor $T_{CM}1$ are at the same potential, the current mirror circuit transistor $T_{CM}1$ acts to set the current $I_2$ to a constant level so long as the voltage from the variable bias circuit 12 does not change. In this embodiment, on the other hand, the dual gate FET 7 and the current mirror circuit transistor $T_{CM}1$ are fabricated with the same structure in the common semiconductor chip but have different gate widths (that is, the current mirror circuit transistor $T_{CM}1$ is given a size as large as one N-th of the dual gate FET 7 (i.e., the transistor T1), where N is a real number). The current mirror circuit transistor $T_{CM}1$ and the dual gate FET 7 construct the current mirror circuit to perform the current mirror action. In this case, the node e, the node a and the second gate $G_2$ of the transistor T1 (or the dual gate FET 7) are at the same potential. As a result, the current mirror is established between the current $I_2$ to flow through the control voltage signal: Vapc, the resistor R1 and the current mirror circuit transistor $T_{CM}1$, and the electric current to flow through the power voltage Vdd, the coil L2, the microstrip line MS2 and the dual gate transistor T1. The current $I_2$ is determined by the characteristics of the control voltage signal Vapc, the resistor R1 and the transistor $T_{CM}1$. In case the gate has the width N, an idle current as high as N times of the current $I_2$ flows between the drain and source of the dual gate FET 7 (i.e., the transistor T1).

In the EDGE mode, the linear action is made to provide the maximum output power of about 29 dBm. Since the EDGE mode is linear, it is not desired to change the output power by changing the bias voltage. Therefore, the control voltage signal Vapc takes a constant value so that the amplitude of the input signal Pin to be fed to the input terminal 2 is controlled to set the output power to a desired value. This control is performed by an AGC using an attenuator to be connected with the input terminal 2.

In addition to the effects of Embodiment 1, according to this embodiment, the gradient (or slope) of the increase in the output power per unit bias voltage applied to the control terminal 6 becomes gentle to improve the controllability of the power control. Therefore, it is possible to control the output power to a low power level. Moreover, the output power is easily controlled from the outside.

Embodiment 2

Figure 7:
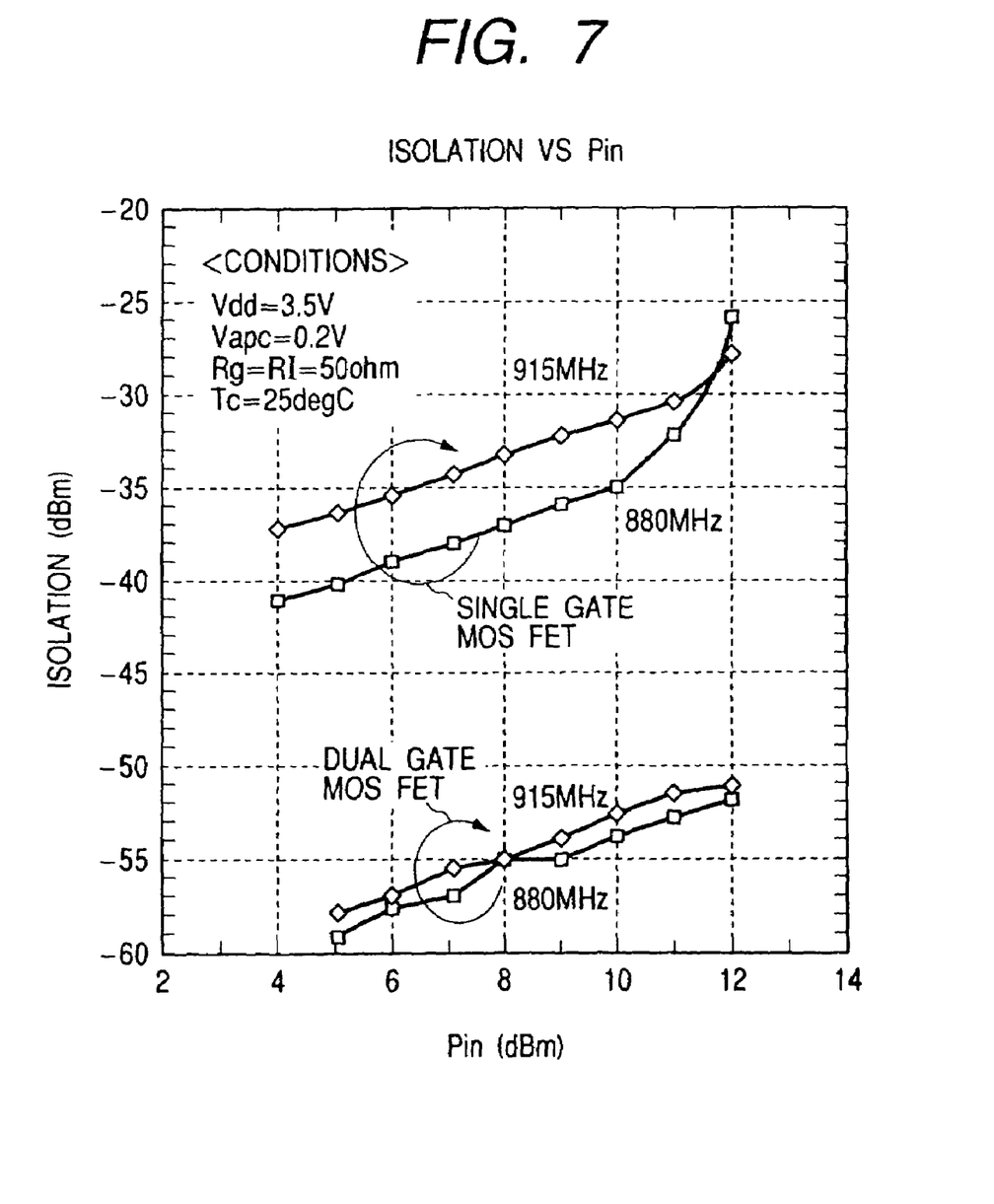
FIG. 7 is a graph plotting isolation characteristics between input/output terminals in the high frequency power amplifier module according to another embodiment (or Embodiment 2) of the invention.

FIG. 7 is a graph plotting isolation characteristics between input/output terminals in the high frequency power amplifier module according to another embodiment (or Embodiment 2) of the invention.

In Embodiment 2, although not especially presented in a circuit diagram, the high frequency power amplifier module has a two-stage amplifying construction of a first stage (or an input stage) and a second stage, of which the first stage is constructed to include the dual gate FET 7 as in Embodiment 1 whereas the second stage is constructed to include a single gate Si-MOSFET. In other words, the first stage acts as a drive stage for the single gate Si-MOSFET or the output stage.

As compared with the three-stage amplifier, the two-stage amplifier is lowered in the isolation characteristics in which the input power leaks from the output terminal, but this isolation can be improved, as shown in FIG. 7, by using the dual gate FET as the driver stage of the two-stage amplifier.

Generally, the two-stage construction of the amplifier is lower in the gain than the three-stage construction so that a higher input power is needed for the same output power. Especially in the GSM mode, the output power of the output stage transistor is controlled for a constant input power with the voltage which is generated by the variable bias circuit. By using the single gate MOSFET as in the prior art, the aforementioned input power is increased to raise the gate potential of the input stage transistor of the amplifier. As a result, an input signal at a certain value or higher enters even if the gate bias of the input stage transistor is set to 0 V. When this input signal exceeds a threshold voltage $V_{th}$ of the input stage transistor, this input stage transistor is turned ON by forming its channel. When the high frequency power amplifier module is adopted in the mobile phone, the power switch or the like is not employed for lowering the power voltage and for reducing the current consumption, but the high frequency power amplifier module is often connected directly with the power source so that it receives the power voltage at all times. As a result, the input signal will leak to the output side.

When the dual gate FET is employed, on the other hand, no channel is formed for the first gate $G_1$ of the dual gate FET to apply no voltage to the drain on the side of the second gate $G_2$, if the voltage of the variable bias circuit is lowered over the threshold voltage $V_{th}$. Even when a high input signal is inputted to the second gate $G_2$ to exceed the threshold voltage $V_{th}$, therefore, no channel is formed for the second gate $G_2$. As a result, it is possible to suppress the leakage power. Therefore, the leakage power after the improvement can be made as small as the leakage due to the coupling by the parasitic capacity or the like.

The circuit can be simplified because the input/output terminals can be easily isolated. Therefore, it is possible to reduce the size of the high frequency power amplifier module 1 and accordingly the size of the wireless communication system.

Here, the AM—AM conversion can also be improved by using the dual gate FET in the driver stage of the two-stage amplifier construction.

Embodiment 3

Figure 8:
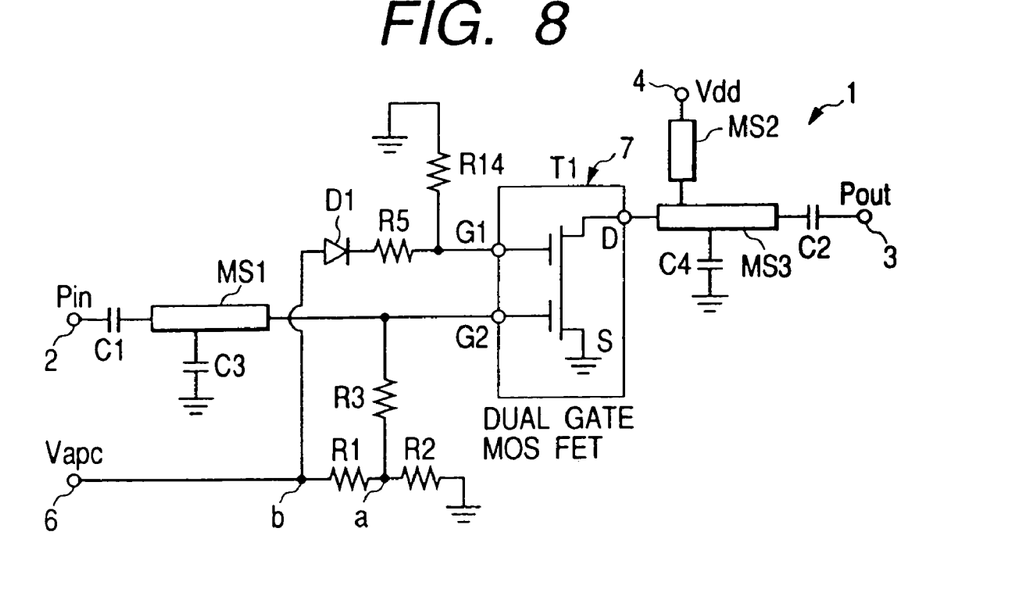
FIG. 8 is a circuit diagram of a high frequency power amplifier module according to another embodiment (or Embodiment 3) of the invention.
Figure 9:
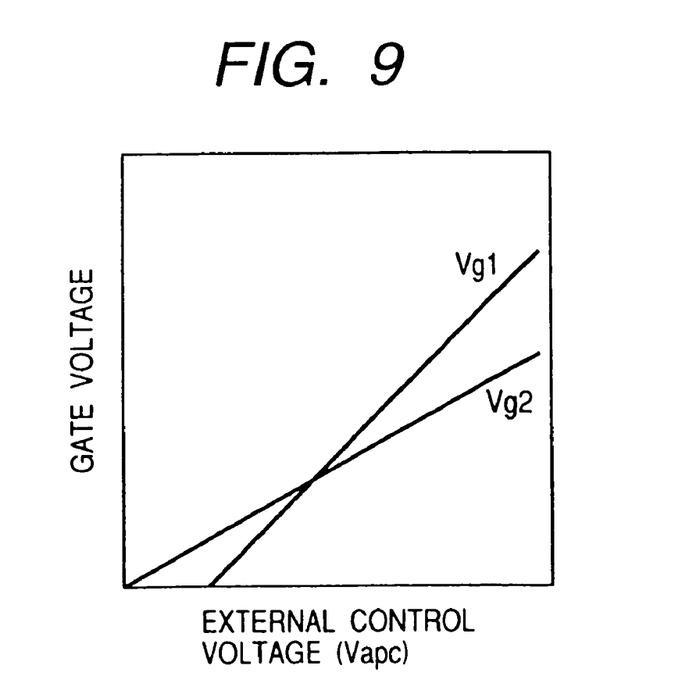
FIG. 9 is a graph illustrating correlations between an external control voltage and a gate voltage in a high frequency power amplifier module packaging a dual gate FET of Embodiment 3.

FIG. 8 is a circuit diagram of a high frequency power amplifier module according to another embodiment (or Embodiment 3) of the invention, and FIG. 9 is a graph illustrating correlations between an external control voltage in a high frequency power amplifier module and a gate voltage of the MOSFET 7.

In the circuit of Embodiment 1, according to Embodiment 3, a diode D1 is connected in series between the node b connected with the control terminal 6 and the resistor R5, and a resistor R14, as connected at its one electrode with the ground, is connected at its other electrode between the first gate $G_1$ of the dual gate FET 7 and the resistor R5. By packaging that diode D1, as shown in FIG. 9, the rise of the potential in the first gate $G_1$ of the dual gate FET 7 shifts from 0 to a plus voltage (or an offset voltage). As a result, the isolation effect when the voltage Vapc is set to 0 V can set the potential Vg1 of the gate $G_1$ to the ground potential even if a residual voltage (e.g., about 0.2 to 0.5 V) is in the voltage Vapc so that the effect can be more reliably attained than the cases of Embodiment 1 and Embodiment 2.

Here, the circuit can be employed in both the single-stage amplifier construction and the multistage amplifier construction.

Embodiment 4

Figure 10:
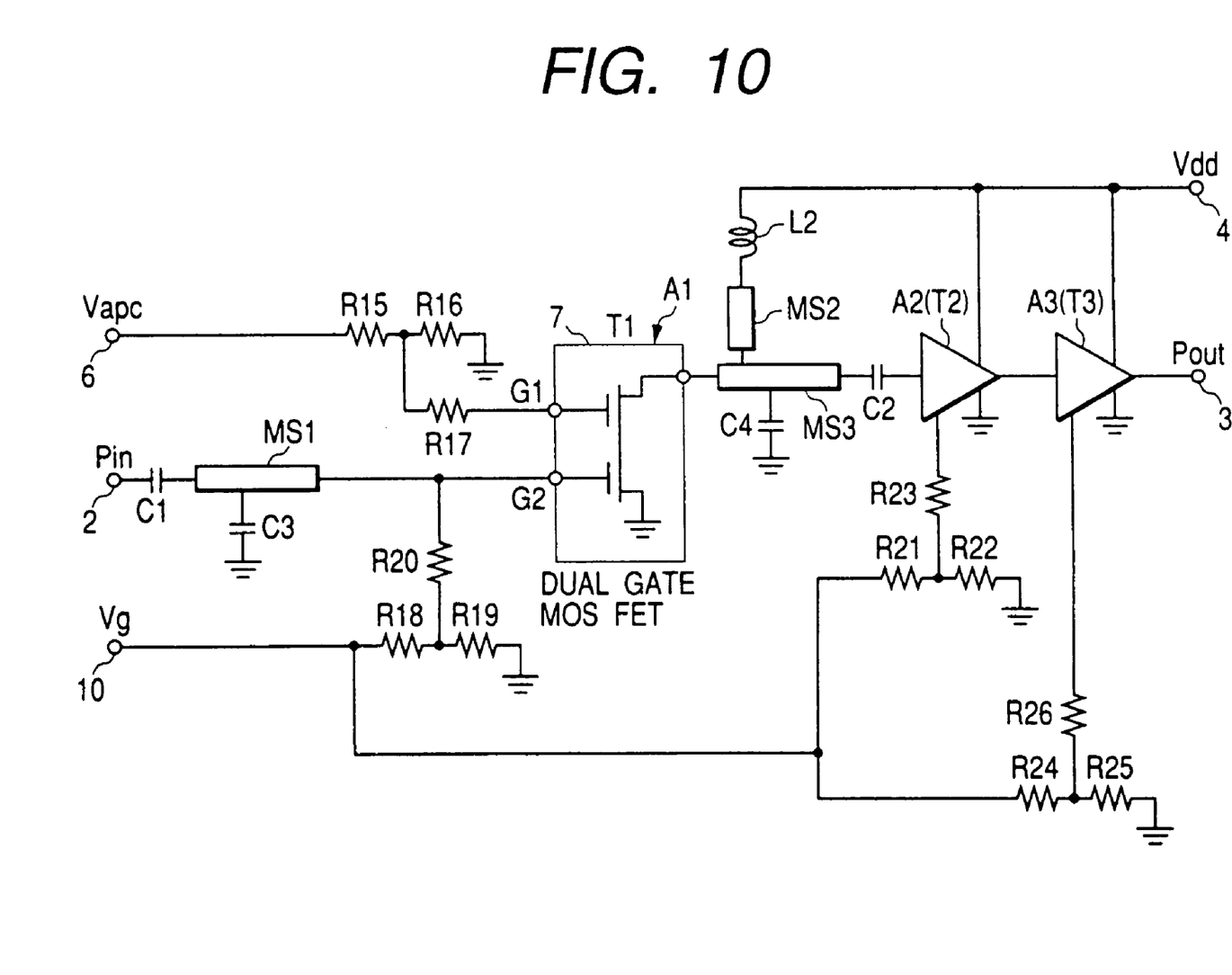
FIG. 10 is a circuit diagram of a high frequency power amplifier module according to another embodiment (or Embodiment 4) of the invention.
Figure 11:
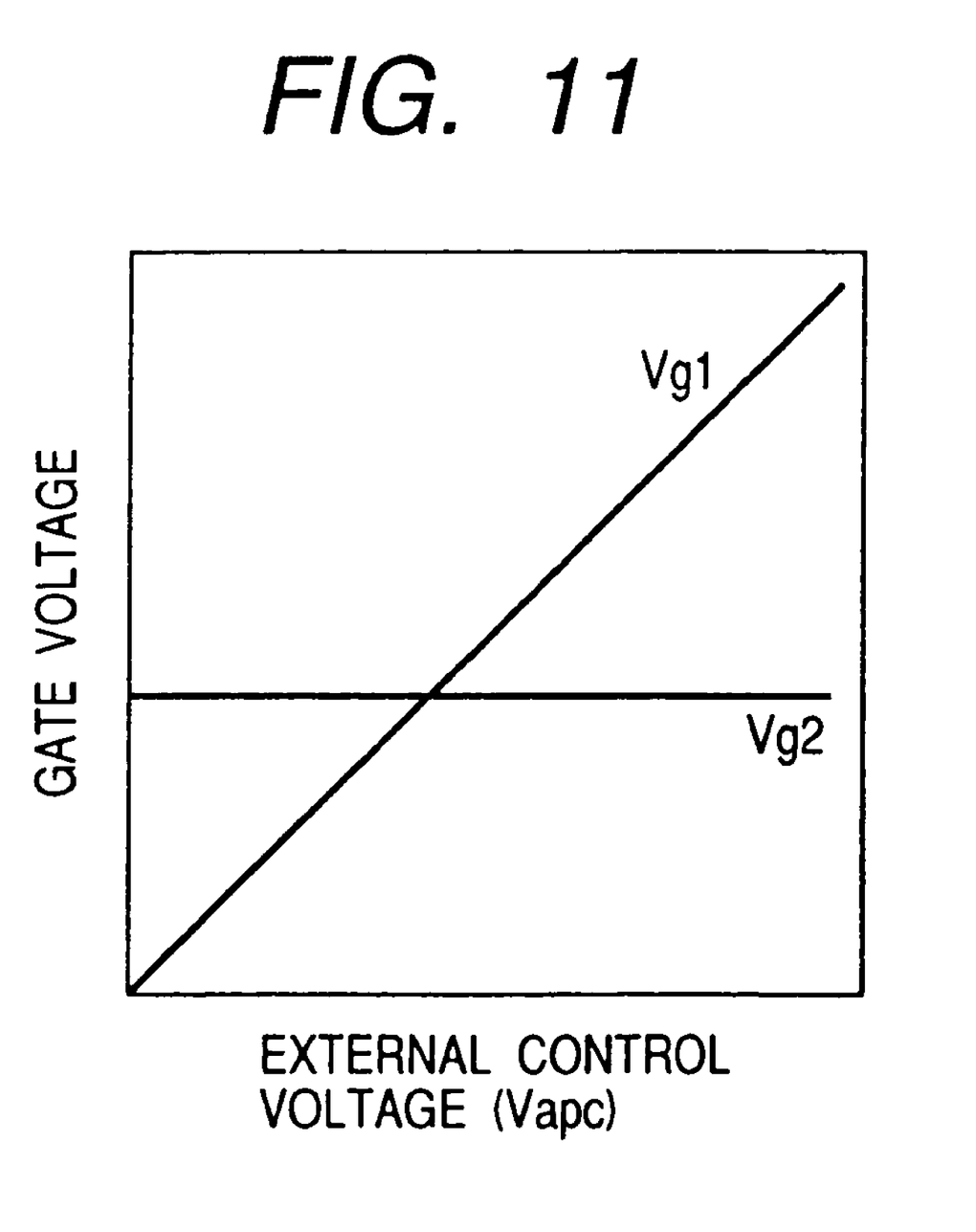
FIG. 11 is a graph illustrating correlations between an external control voltage and a gate voltage in a high frequency power amplifier module packaging a dual gate FET of Embodiment 4.

FIG. 10 is a circuit diagram of a high frequency power amplifier module according to another embodiment (or Embodiment 4) of the invention, and FIG. 11 is a graph illustrating correlations between an external control voltage in a high frequency power amplifier module and a gate voltage of the MOSFET 7.

In Embodiment 4, the control voltage is generated by a voltage divider which is connected between the first gate $G_1$ of the first stage dual gate FET 7 and the control terminal 6 and which is constructed to include resistors R15 to R17. This control voltage is the output, i.e., a control voltage Vagc of the not-shown AGC (Auto Gain Control) circuit.

The gate $G_2$ of the first stage dual gate FET 7 is fed as in Embodiment 1 with the input signal Pin from the input terminal 2 and a control voltage Vg from the gate control terminal 10. A bias voltage is applied to the gates of the transistors T1, T2 and T3 (e.g., to the second gate $G_2$ in the transistor T1) by a bias circuit which has first, second and third stages constructed to include three resistors (R18 to R20, R21 to R23, and R24 to R26), respectively.

In Embodiment 4, the correlations between the external control voltage and the gate voltage are illustrated in FIG. 11. In Embodiment 4, the second gate $G_2$ is set to a constant potential. As a result, the output power and the gain can be controlled with the change in the applied voltage to the gate $G_1$, and the fluctuation of the input impedance of the gate $G_2$ at the output power control time can be suppressed. Thus, there is obtained an effect for suppressing the affections on the radio signal generator on the input side.

According to Embodiment 4, on the other hand, it is possible to incorporate the function (i.e., the control function by the AGC circuit) which has to be added in the prior art from the outside.

Although our invention has been specifically described on the basis of its embodiments, it should not be limited to the embodiments but could naturally be modified in various manners without departing from the gist thereof. For example, the semiconductor amplification element can be likewise applied with similar effects even if it is made of a compound semiconductor of GaAs or the like. On the other hand, the dual gate FET could also be constructed by preparing two transistors corresponding to the gate $G_1$ and the gate $G_2$ and by connecting the two transistors in a manner to have a series connection in their drain-source paths.

The effects to be obtained from the representative of the inventions, as disclosed herein, will be briefly described in the following.

It is possible to provide a high frequency power amplifier module, in which the GSM system (for the saturated actions) and the EDGE system (for the linear actions) are compatible in the common circuit, and a wireless communication system.

It is possible to provide a high frequency power amplifier module capable of improving the AM—AM conversion, and a wireless communication system.

It is possible to provide a high frequency power amplifier module which finds it easy to isolate the input/output terminals and it hard to cause the signal leakage, and a wireless communication system.

Because the input/output terminals can be easily isolated, the circuit can be simplified to provide a small-sized high frequency power amplifier module and a small-sized wireless communication system.

It is possible to provide a high frequency power amplifier module which can be easily power-controlled.

What is claimed is:

1. A high frequency power amplifier module, comprising:
   an input terminal for receiving a high frequency signal;
   a control terminal for receiving a control signal;
   a dual gate type field effect transistor including a first gate and a second gate between a drain and a source, the first gate being closer to the drain and coupled to receive a signal according to the control signal from the control terminal, and the second gate being closer to the source and coupled to receive the high frequency signal from the input terminal;
   an output terminal coupled to the drain; and
   a bias circuit having an input coupled to the control terminal and an output coupled to the second gate of the dual gate type field effect transistor, and for generating a bias voltage according to the control signal to the second gate of the dual gate type field effect transistor, wherein the signal is the bias voltage.

2. A high frequency power amplifier module, comprising:
   an input terminal for receiving a high frequency signal;
   a control terminal for receiving a control signal;
   a dual gate type field effect transistor including a first gate and a second gate between a drain and a source, the first gate being closer to the drain and coupled to receive a signal according to the control signal from the control terminal, and the second gate being closer to the source and coupled to receive the high frequency signal from the input terminal; and
   an output terminal coupled to the drain;
   wherein the control signal has a plurality of levels according to a plurality of operation modes, and
   wherein the plurality of operation modes include a GSM (global system for mobile communication) mode and an EDGE (enhanced data rates for GSM evolution) mode.

* * * * *